United States Patent [19]

Christin

[11] Patent Number: 4,823,734

[45] Date of Patent: Apr. 25, 1989

[54] INSTALLATION FOR THE CHEMICAL VAPOR INFILTRATION OF A REFRACTORY MATERIAL OTHER THAN CARBON

[75] Inventor: François Christin, Saint Aubin De Medoc, France

[73] Assignee: Societe Europeenne De Propulsion, France

[21] Appl. No.: 112,609

[22] PCT Filed: Feb. 9, 1987

[86] PCT No.: PCT/FR87/00036

§ 371 Date: Dec. 7, 1987

§ 102(e) Date: Dec. 7, 1987

[87] PCT Pub. No.: WO87/04733

PCT Pub. Date: Aug. 13, 1987

[30] Foreign Application Priority Data

Oct. 2, 1986 [FR] France .............................. 86 01790

[51] Int. Cl.[4] .............................................. C23C 16/00
[52] U.S. Cl. .................................... 118/719; 118/715; 118/724; 118/725; 118/730
[58] Field of Search ............... 118/715, 724, 725, 719, 118/730

[56] References Cited

U.S. PATENT DOCUMENTS 3,925,577 12/1975 Fatzer .................................. 427/253

FOREIGN PATENT DOCUMENTS 2207888 6/1974 France.
2401888 3/1979 France.

OTHER PUBLICATIONS

A. J. Caputo et al., "Development of a New, Faster Process for the Fabrication of Ceramic Fiber-Reinforced Ceramic Composites by Chemical Vapor Infiltration", Ceramic Engineering and Science Proceedings, vol. 6, No. 7/8, Jul.-Aug. 1985, pp. 694–706, Figure 1.

Primary Examiner—Richard Bueker
Attorney, Agent, or Firm—Brumbaugh, Graves, Donohue & Raymond

[57] ABSTRACT

An armature in graphite constitutes a sealed structure housed with an inductor inside an enclosure, and defines a reaction chamber, connected outside the enclosure, with reactant gases supplying means; the enclosure is supplied with inert gas in order to keep a permanent flow of inert gas in the space surrounding the armature inside the enclosure, and the reactant products are removed from the reaction chamber and the inert gas from the enclosure by means of respective outlet pipes which join up outside the enclosure, so that substantially equal pressures are maintained in the enclosure, inside the outside the reaction chamber.

6 Claims, 2 Drawing Sheets

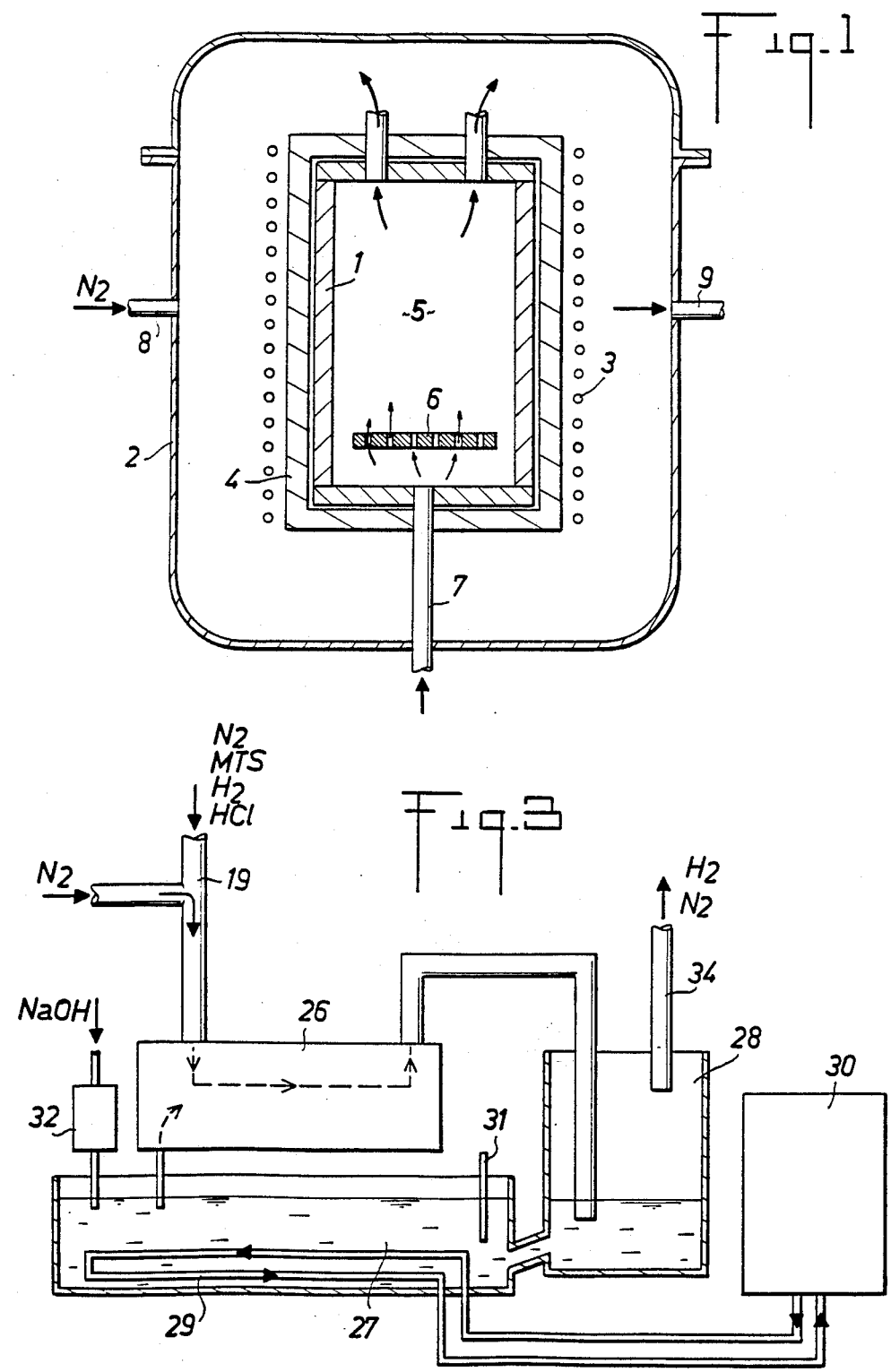

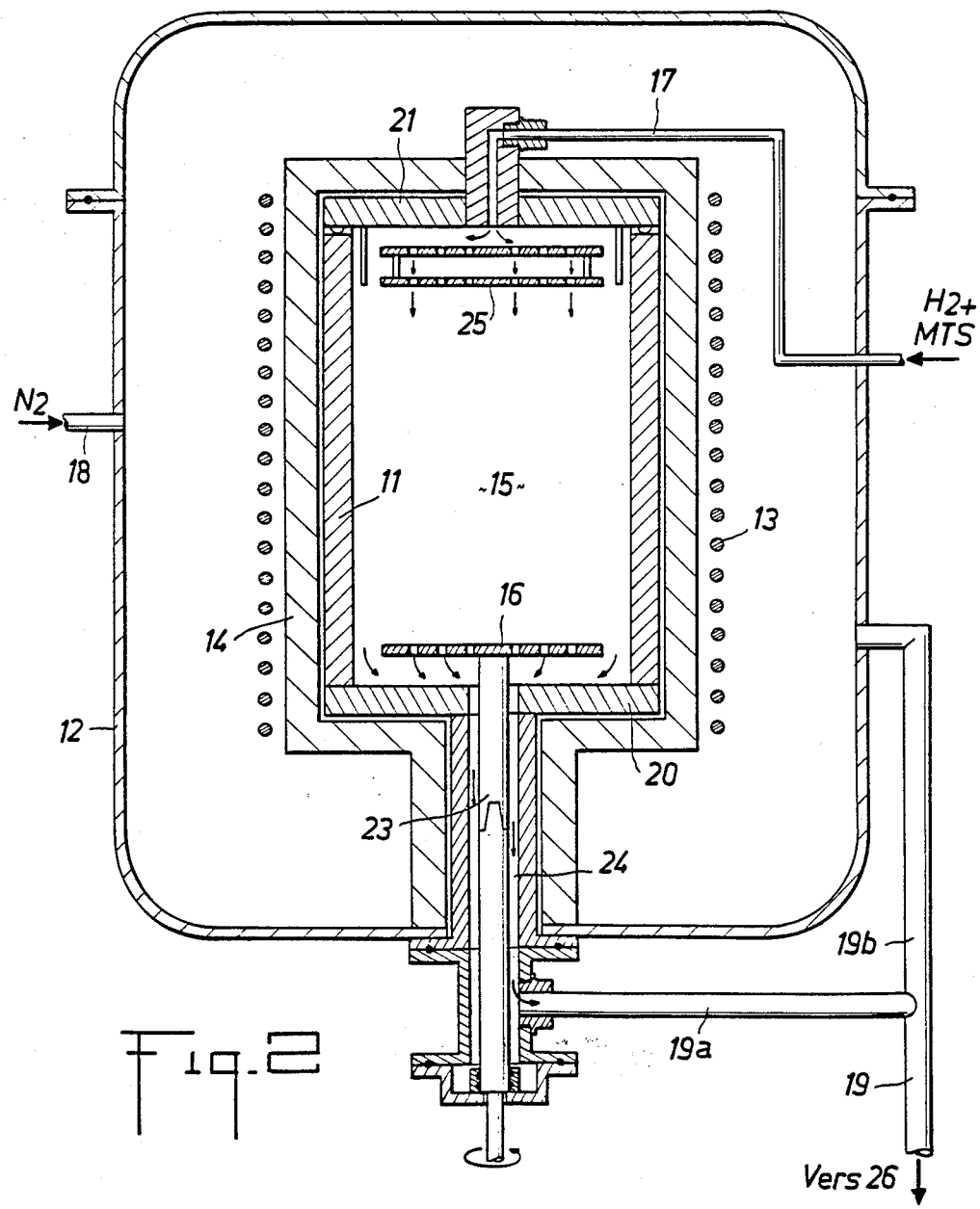

INSTALLATION FOR THE CHEMICAL VAPOR INFILTRATION OF A REFRACTORY MATERIAL OTHER THAN CARBON

The present invention relates to an installation for the densification of porous pieces by chemical vapor infiltration of a refractory material other than carbon.

The field of application of the invention, therefore, is the production of composite pieces with refractory matrix in a material different from carbon, for example in silicon carbide or alumina.

Industrial installations are already known to be used for densifying porous pieces by chemical vapor deposition of carbon in order to produce composite pieces in carbon-carbon.

These installations however have proved unsuited for the infiltration of materials such as silicium carbide or alumina. One reason for this is that the infiltration of such materials requires the use of reactant gases or implies the production of reaction products such as hydrochloric acid which are chemicals difficult to manipulate. Another reason is the difficulty to perform uniform infiltrations without any undesirable deposits.

It is the object of the present invention to propose an installation permitting the densification of porous pieces with a refractory material such as silicium carbide or alumina, in the conditions of safety and reliability expected at industrial level.

This object is reached with an installation of the type comprising a graphite armature defining a reaction chamber, an inductor surrounding the armature and heating the reaction chamber by induction, a sealed enclosure containing said armature and inductor, means for supplying reactant gases to the reaction chamber, means for supplying inert gas to the enclosure, and means for removing gases from said reaction chamber and said enclosure, installation wherein, according to the invention, the armature constitutes a tight structure inside the enclosure and is connected outside said enclosure with the reactant gases supplying means, the enclosure is supplied with inert gas in order to keep up a permanent flow of inert gas in the space around the armature inside the enclosure, and the removal of gases from the reaction chamber and of inert gas from the enclosure is achieved via respective outlet conduits which join up outside the enclosure, so that substantially equal pressures are maintained in the enclosure, inside and outside the reaction chamber.

The tight structure of the armature prevents the reactant gases and the reaction products from coming into contact with parts of the infiltration furnace outside the armature, and in particular the metallic inductor, which parts could be attacked by these gases. The sweeping through of the enclosure outside the armature with a neutral gas creates a protection by forming a cushion around the reaction chamber. Furthermore, the fact of keeping the pressures equal in the enclosure, both inside and outside the armature, prevents any leak of neutral gas into the reaction chamber, which would interfere with the infiltration process, or any leak of the aggressive or dangerous reactant gases or reaction products in the enclosure, outside the reaction chamber.

Preferably, the gas removing means comprise a pumping device with water ring, such as a water ring pump, to which are connected the outlet pipes. With such a pumping device, removal of the corrosive products, such as hydrochloric acid, is made possible without the need for expensive protection systems normally required in other pumping devices such as vane pumps.

The invention will be more readily understood on reading the following description with reference to the accompanying drawings in which:

FIG. 1 is a very diagrammatical view of a known installation for the chemical vapor infiltration of carbon;

FIG. 2 is a diagrammatical view of an embodiment of the installation according to the invention for the chemical vapor infiltration of silicium carbide; and FIG. 3 is a partial view showing in more detail the gas removing device of the installation according to FIG. 2.

Referring first to FIG. 1, this very diagrammatically shows a prior art furnace for the chemical vapor infiltration of carbon. A graphite armature 1 is housed inside a sealed metallic enclosure 2. A metallic inductor 3 is also disposed inside the enclosure 2, around the armature 1 with interposition of a heat insulating material 4. Armature 1 defines a reaction chamber 5 in which the porous pieces to be densified are placed on a support 6. Chamber 5 is supplied with reactant gases through a conduit 7 which issues into the bottom of the chamber and enclosure 2 is supplied with neutral gas (nitrogen) through a conduit 8. The reaction products and reactant gases which are not used, are removed from the reaction chamber 5 through vents formed at the top thereof, then they are removed from the enclosure, with the neutral gas, via an outlet pipe 9 which opens into enclosure 2 on the opposite side of conduit 8.

Chemical vapor deposition of carbon through the porosity of the pieces to be densified is achieved by cracking alkanes, and in particular methane, or mixtures of methane and heavier alkanes. In suitable conditions of temperature and pressure, these reactant gases produce carbon and hydrogen. Removal of the hydrogen, the non-decomposed alkanes and the nitrogen is achieved by pumping, in order to maintain the wanted pressure inside the reaction chamber, the manipulation of these gases raising no particular problem at industrial level.

On the contrary, the chemical vapor infiltration of refractory materials other than carbon, raises difficulties.

For example, the infiltration of silicium carbide is achieved by decomposition of a chemical product more complex than alkanes, such as methyltrichlorosilane $CH_3SiCl_3$ (hereinafter designated MTS) which, in the presence of hydrogen $H_2$ serving as catalyst and in suitable conditions of temperature and pressure, produces silicon carbide SiC and hydrochloric acid HCl. MTS, which is liquid in standard conditions of temperature and pressure, is difficult to manipulate because of its aggressive nature; the same of course applies to hydrochloric acid. The infiltration of silicon carbide raises yet other problems such as uneven deposition and the presence of undesirable deposits of silicon and carbon.

The same problems are met in the case of infiltrations of other materials different from carbon, such as for example alumina. In general, for the operational conditions to be observed for the chemical vapor infiltration of refractory materials other than carbon, reference can be made to French Pat. No. 2 401 888.

The aforesaid problems can be solved with an infiltration installation according to the invention of which one embodiment is illustrated in FIG. 2.

Said installation conventionally comprises a graphite armature 11 housed in a sealed metallic enclosure 12 and defining a reaction chamber 15. Inside the enclosure 12, armature 11 is surrounded by a metallic inductor 13 with interposition of a heat insulating material 14.

According to one characteristic of the invention, armature 11 constitutes a sealed structure. It is in the form of a cylinder of vertical axis closed at its lower part by a base 20 which is joined to the lateral wall and at its upper part by a removable lid 21, resting over the upper rim of the side wall of the armature.

Inside chamber 15, the pieces to be densified are placed on a tray 6 which is pivotable about a vertical axis coinciding with that of armature 11 and of inductor 13. The pivoting movement of tray 16 is controlled by a motor (not shown) coupled to a shaft 23 traversing the lower part of enclosure 12 and the base 20 of the armature and fixed to the lower face of tray 16.

Chamber 15 is supplied with reactant gases, for example MTS and hydrogen $H_2$ serving as catalyst for the deposition of silicium carbide by decomposition of MTS, through a pipe 17 traversing the wall of enclosure 12 and reaching to the upper part of said chamber through the lid 21. Exhaust of the gases from chamber 15 is achieved by means of one or more pipes 19a opening at the lower part of chamber 15 and traversing the base 20 of the armature and the lower wall of the enclosure. In the illustrated example, the gases are removed from chamber 15 through a passage 24 of annular cross-section surrounding the shaft 23 and which is connected with a pipe 19a, outside the enclosure 12.

The reactant gases flowing into chamber 15 come first in contact with the pre-heating plates 25. Said latter are for example in the form of superposed perforated plates. Since the pre-heating plates are situated inside the reaction chamber, they are permanently at the temperature prevailing in said chamber, which temperature is set so as to allow optimum infiltration. The reactant gases flowing through the pre-heating plates 25 are thus heated by them to the wanted temperature before they come into contact with the pieces to be densified. Said pre-heating plates 25 also have the added function of trapping any undesirable deposits, experience having proved that said deposits have a tendency to form over the first surfaces encountered by the reactant gases when these have reached the decomposition temperature. Because of their position at the top of the reaction chamber, the pre-heating plates 25 are readily accessible, for periodical cleaning, when lid 21 is removed. Although in the illustrated example, the pre-heating device is in the form of perforated plates, it can of course take on any other form capable of pre-heating the reactant gases and of trapping any undesirable deposits by contact with the reactant gases as soon as these flow into the reaction chamber.

The volume situated around armature 11 inside enclosure 12 is permanently swept with a neutral gas, such as nitrogen $N_2$, which is brought through a pipe 18 and removed through a pipe 19b. A cushion of neutral gas is thus formed around the reaction chamber. When gases presenting certain dangers are admitted into the reaction chamber, such as for example hydrogen $H_2$ because of its explosive nature, the cushion of neutral gas creates a protection against any leaks from the reaction chamber.

Outside the enclosure, pipes 19a and 19b join up to form a single outlet pipe 19 which is connected to a pumping device 26. Said latter makes it possible to keep up the pressure in the reaction chamber 15 to the lowest value necessary for the infiltration. The pressures prevailing in enclosure 12, inside and outside armature 11, are kept to equal values due to the joining up of pipes 19a and 19b. This avoids setting up of a differential pressure which could cause a leak of neutral gas inside the reaction chamber or a leak of reactant gases outside thereof.

Pumping device 26 is of the type with liquid ring. The presence of chemicals, difficult to manipulate, such as non-decomposed MTS and hydrochloric acid among the gases extracted from the infiltration furnace does not permit the use of vane pumps without special precautions being taken such as using liquid nitrogen traps in order to convert the MTS and the hydrochloric acid into solids. But such a solution would, at industrial level, present a number of disadvantages: frequent cleaning of the liquid nitrogen traps, control of the level of liquid nitrogen, corrosion of the pump, high cost price. These disadvantages are prevented by the use of a liquid ring pumping device.

Liquid ring pumps are known per se. They consist in starting a liquid moving, thus creating a depression by cavitation Preferably, the pumping device 26 is with water ring and comprises one or more pumps in series. The pump or pumps can operate in a non-recycled water configuration (open water circuit) or in a recycled water configuration (closed water circuit).

In this last case, when hydrochloric acid is present in the pumped gases, the acidity of the industrial water used must be watched. This can be done by injecting a base, such as soda, in order to continuously neutralize the hydrochloric acid present in the water circuit.

FIG. 3 shows a pumping device with water ring working in a recycled water configuration. The water ring pump 26 receives, first the gases extracted from the infiltration furnace (MTS, hydrochloric acid, hydrogen and nitrogen) and, second, the industrial water sucked up from a recycling tank 27. The water and the gases discharged by the pump 26 are brought to a decanting tank 28. The remaining gases (essentially hydrogen and nitrogen) are removed from tank 28 through a pipe 34 whereas the water is returned from the decanting tank to the recycling tank 27. To prevent a progressive warming up of the industrial water from contact with the gases coming from the infiltration furnace, and from the energy dissipated by the pump, a cooling coil 29 is placed inside the tank and is run through by a cooling fluid flowing in closed circuit between the coil 29 and a refrigerating unit 30.

The acidity of the water is controlled by means of a pH measuring probe 31 which delivers a signal representative of the pH of the water inside the recycling tank. A control circuit (not shown) receives the signal from the probe 31 to control the injection of soda into the tank 27 by means of a pump 32 when the pH goes down below a predetermined threshold.

It will also be noted that the non-decomposed MTS present in the extracted gases, causes, by reaction with the water, the formation of silica. The deposition of said silica in the pipes with an added risk of obstruction after a while, is prevented due to the pipes being swept through by the nitrogen $N_2$ brought into pipe 19 immediately upstream of the pump 26.

The operation of the afore-described installation is obvious from the foregoing. The reactant gases, pre-heated at the wanted temperature by means of pre-heating plates 25, come into contact with the pieces to be densified which are placed on the pivoting tray 16 in order to form the wanted deposit within the porosity of said pieces. Since the flow of reactant gases is not regular throughout the whole section of the reaction chamber, the pivoting movement of tray 16 makes it possible, nevertheless, to obtain regular deposits inside the pieces to be densified.

As already indicated, the installation according to the invention finds a particularly advantageous application in the industrial production of composite pieces with matrix in silicon carbide. But the installation according to the invention can also be used for producing composite pieces with matrix in a different material from carbon, and which is not silicon carbide, such as for example, alumina, by chemical vapor infiltration of alumina performed by reacting aluminium chloride with carbon dioxide and hydrogen, this giving for example alumina and hydrochloric acid, in special conditions of temperature and pressure.

What is claimed is:

1. An installation for the densification of porous pieces by chemical vapor infiltration of a refractory material other than carbon, installation comprising a graphite armature defining a reaction chamber, an inductor surrounding the armature and heating the reaction chamber by induction, a sealed enclosure containing said armature and inductor, means for supplying reactant gases to the reaction chamber, means for supplying inert gas to the enclosure, and means for removing gases from said reaction chamber and said enclosure, wherein, the armature constitutes a tight structure inside the enclosure and is connected outside said enclosure with the reactant gases supplying means, the enclosure is supplied with inert gas in order to keep up a permanent flow of inert gas in the space around the armature inside the enclosure, and the removal of gases from the reaction chamber and of inert gas form the enclosure is achieved via respective outlet conduits which join up outside the enclosure, so that substantially equal pressures are maintained in the enclosure, inside and outside the reaction chamber.

2. An installation as claimed in claim 1, wherein the gas extracting means comprise a liquid ring pumping device.

3. An installation as claimed in claim 2, wherein the pumping device comprises at least a water ring pump, a closed circuit in which flows the industrial water from the pump and means for controlling the acidity of the water.

4. An installation as claimed in claim 1, wherein a pre-heating device is provided inside the reaction chamber for pre-heating the reactant gases on their flowing path between the inlet into the reaction chamber and the pieces to be densified.

5. An installation as claimed in claim 1, wherein the armature has a cylindrical shape with vertical axis and is provided at its upper part with a removable lid.

6. An installation as claimed in claim 1, wherein the means for supplying reactant gases to the reaction chamber open into the upper part of said chamber whereas exhaust of the gases from the reaction chamber takes place at the bottom part of said chamber, the gases inside the reaction chamber flowing from the top towards the bottom.

* * * * *